United States Patent [19]

Kash et al.

[11] Patent Number: 5,422,898
[45] Date of Patent: Jun. 6, 1995

[54] TAPERED FABRY-PEROT MULTI-WAVELENGTH OPTICAL SOURCE

[75] Inventors: Jeffrey A. Kash, Pleasantville; David W. Kisker, Purdys, both of N.Y.; Bardia Pezeshki, Bridgeport; Franklin F. Tong, Stamford, both of Conn.

[73] Assignee: International Business Machines Corporation, Armonk, N.Y.

[21] Appl. No.: 145,259

[22] Filed: Oct. 29, 1993

[51] Int. Cl.⁶ ............................................. H01S 3/19
[52] U.S. Cl. .................................. 372/23; 372/45; 372/50; 372/92
[58] Field of Search .................... 372/23, 45, 50, 92

[56] References Cited

U.S. PATENT DOCUMENTS 5,214,664  5/1993  Paoli ............................... 372/23
5,228,050  7/1993  LaCourse et al. ............... 372/50

Primary Examiner—James W. Davie
Attorney, Agent, or Firm—Douglas W. Cameron

[57] ABSTRACT

This invention covers an apparatus for generating multiple wavelengths of light, where the intensity of each wavelength is separately controlled, and where all the wavelengths exit the device from the same aperture. Structurally, this multiple wavelength source consists of a passive waveguide coupled to an active tapered resonator. The light generated in the resonator couples to the passive waveguide and exits from the ends of the device. By pumping different regions of the resonator, different wavelengths can be obtained.

9 Claims, 6 Drawing Sheets

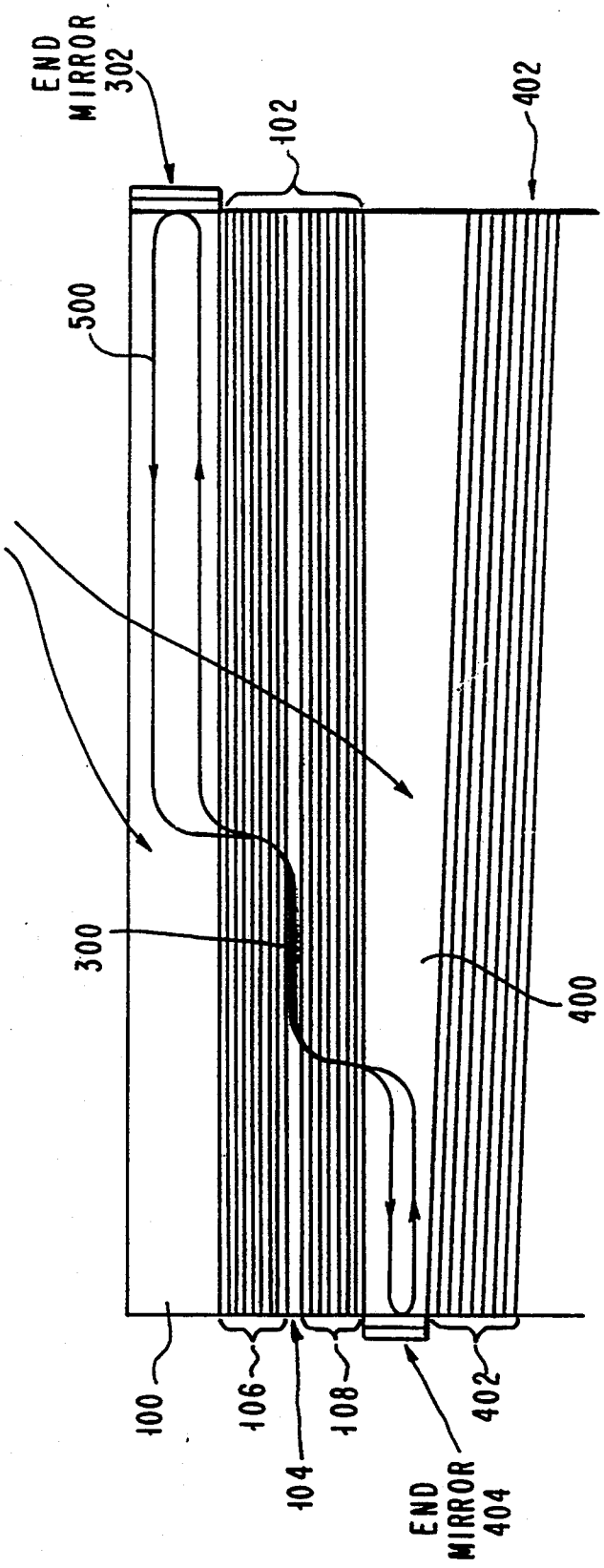

TAPERED FABRY-PEROT MULTI-WAVELENGTH OPTICAL SOURCE

DESCRIPTION

1. Technical Field

This invention relates to a method and apparatus for providing multiple, independently controllable, wavelengths of light from one aperture of a semiconductor device.

2. Background of the Invention The information capacity of an optical link can be increased by using a number of different wavelengths in the same link. This wavelength division multiplexing (WDM) scheme has been difficult to implement due to a lack of suitable devices. Generally, a number of fixed wavelength lasers must be combined using a multiplexer, and then demultiplexed at the receiver end. The multiplexers and demultiplexers tend to be very complicated, expensive, and lossy.

Rather than using a number of lasers together with a multiplexer, it would be advantageous to have one light source that can emit multiple wavelengths, with each wavelength separately controlled with an electrical input. Though related efforts have achieved considerable success, at present, no such a multiple wavelength light source has been realized. Most of the effort to date has centered on laser arrays, where adjacent devices emit different wavelengths, and tunable single source lasers.

Probably the most interesting multiple wavelength array was demonstrated by Bellcore researchers (Connie J. Chang-Hasnain et al. IEEE Journal of Quantum Electronics, Vol 27, pp.1368–1376, 1991), where each surface-emitting laser in the array had a different wavelength. A non-uniformity in the deposition of the layers changed the effective cavity length of each device, causing the wavelengths of adjacent devices to differ by a given amount. Though this array can produce multiple independently controllable wavelengths, the light comes out of different apertures. Thus coupling all the wavelengths into the same fiber is still a formidable task. What would be much better than an array of different wavelength devices is one device that can emit multiple wavelengths out of the same aperture.

Tunable lasers have also attracted a good deal of attention for WDM systems. If a tunable laser can be fabricated, the WDM transmitters can consist of the same laser type, with each laser tuned to a different wavelength. This would be considerably simpler than forming an array of different lasers with fixed wavelengths. Tunability can be achieved by using a variety of physical and nonlinear effects. For example, changing the temperature of the device will shift the bandgap, and modify the output wavelength. In lasers where the lasing wavelength is determined by an optical distance, such as vertical cavity devices, or distributed Bragg reflector lasers (DBR), a change in refractive index will also cause the output wavelength to shift. Thus many tunable lasers have a section of the cavity where current injection causes an index shift and varies the output wavelength. Unfortunately, thermal tuning is quite slow, while index tuning using carrier injection only changes the refractive index by a small amount. Thus tuning ranges are limited.

Recently, a new type of tunable laser diode has been invented that can tune over a much larger range using carrier injection. (See M. -C. Amann, and S. Illek, IEEE Journal of Lightwave technology, vol 11, pp. 1168–1182). These transverse tuning schemes use a lever effect to magnify any index change. In almost every structure the relative tuning range is equal to the relative index change ($\Delta\lambda/\lambda = \Delta n/n$), but in these structures the relative tuning range is magnified by the difference of two refractive indices in two coupled waveguides. By making the difference in indices of the two waveguides small, the tuning range is expanded. The structure is quite complicated requiring numerous regrowth steps, and of course the device only emits one wavelength of light.

U.S. Pat. No. 4,715,672 discloses a type of waveguide that uses anti-resonant layers to confine the light in the waveguide.

U.S. Pat. No. 4,745,607 to Koch discloses an optical waveguide similar to the above patent, except that a grating in one of the reflecting anti-resonant layers below the waveguide is used to extract the energy of a selected wavelength from the waveguide.

U.S. Pat. No. 5,144,498 discloses a resonant Fabry-Perot cavity having at least two reflective surfaces whose separation distances increases or decreases monotonically with distance along the length of the device.

U.S. Pat. No. 5,119,454 to McMahon discloses an optical multiplexing/demultiplexing device which combines two parallel mirrors and a defraction grating so as to emit selected optical wavelengths from different locations along the length of the device.

U.S. Pat. No. 4,825,262 to Mallinson discloses a Fabry-Perot interferometer where the position of a diaphragm is altered to vary the response of the interferometer.

SUMMARY OF THE INVENTION

It is therefore an object of this invention to provide a multiple wavelength source that can emit many different wavelengths simultaneously. The invention is an advance over multiple wavelength arrays in that all the light is emitted out of one aperture. It is also an advance over tunable structures, since it can emit more than one wavelength.

The multiple wavelength source has a simple structure that is similar to our previous patent application on a wavelength demultiplexer (Ser. No. 08/052/343) entitled: "Tapered Fabry-Perot Waveguide Optical Demultiplexer", filed on Apr. 22, 1993 and assigned to the same assignee as the current application). Without optical feedback it acts as a luminescence source, while with feedback, lasing can be achieved at various wavelengths. The design principles and equations are analogous to those described in the above patent application, which is hereby incorporated by reference. The structure differs in that the cavity contains optical gain, and the mirror reflectivities are such that the light generated in the cavity is transferred to the passive waveguide.

Accordingly, this invention provides an apparatus for emitting multiple wavelengths through a common aperture and comprises a laser cavity (optical resonator) having multiple gain regions and a means for directing each of the optical wavelengths through a unique feedback loop which passes through a corresponding one of the regions.

More specifically, the invention provides an apparatus for emitting multiple wavelengths and comprises a tapered resonator with multiple gain regions for generating multiple wavelengths in combination with a waveguide which is optically coupled to the resonator and receives the generated wavelengths and passes thorn through a common aperture.

BRIEF DESCRIPTION OF THE DRAWINGS

FIG. 6 shows the preferred embodiment including an additional waveguide below the resonator.

DESCRIPTION OF THE PREFERRED EMBODIMENT

Figure 1:
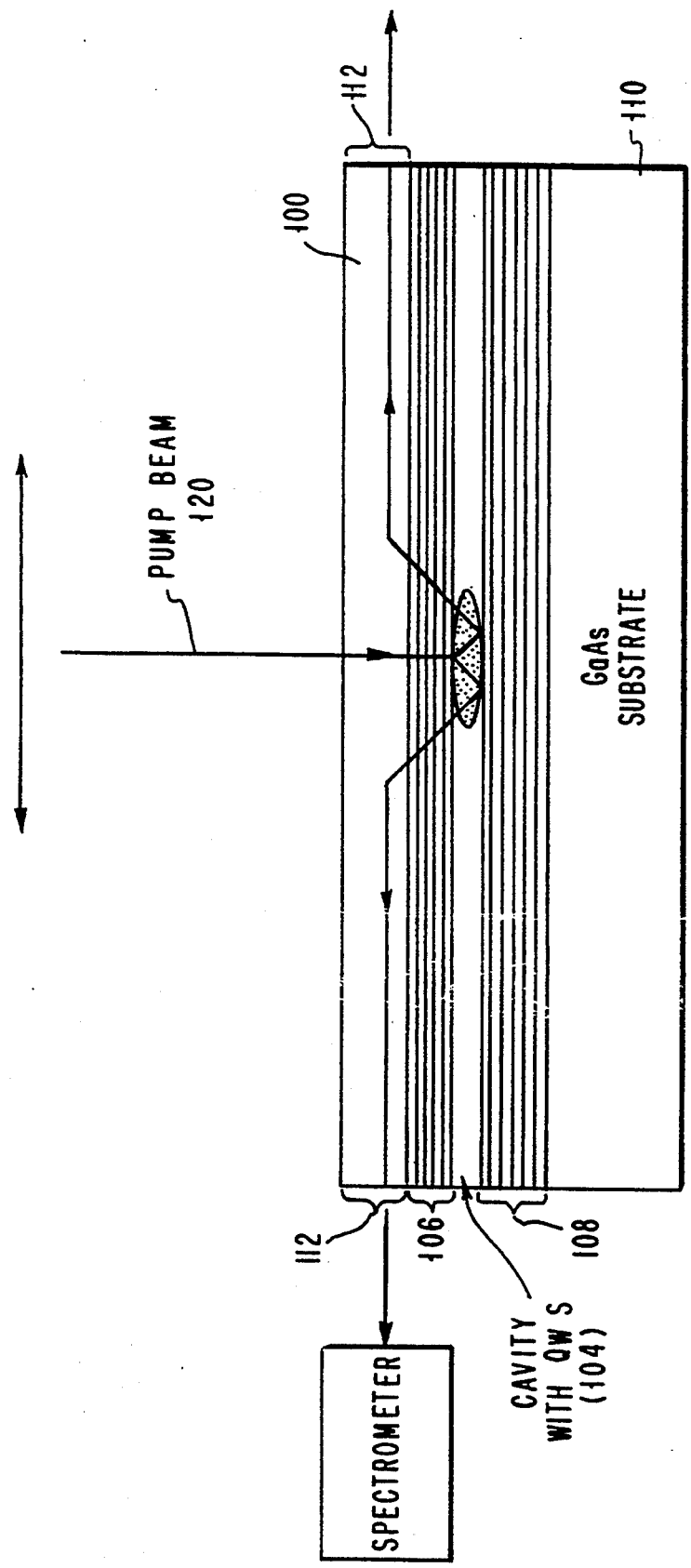
FIG. 1 schematically illustrates a multi-wavelength source without optical feedback and optical excitation of the gain regions.

In FIG. 1, we show the embodiment of the device with no optical feedback. Such a structure will provide luminescence at various wavelengths (multiple wavelength light omitting diode). The device structure is composed of an optical waveguide (100) on top of a tapered Fabry-Perot resonator (102). This waveguide can be fabricated with a multi-layer mirror to confine the light in the waveguide in the manner of U.S. Pat. No. 4,715,672. Each layer in the multi-layer mirrors in an anti-resonant layer that contributes to the reflectivity. The resonator contains material (104) capable of light emission and optical gain if excited. Otherwise, the material is absorbing. For example, this material might be GaAs quantum wells (QW) with AlGaAs barriers. The resonator necessarily has two mirrors (106) and (108). These mirrors can either be multi-layers, with each layer acting in anti-resonance, or these mirrors reflect using total internal reflection. The thicknesses of these multi-layers and the resonator itself are governed by the equations expressed in our previous patent application. Mirror (106) must be partially reflecting to allow the light to couple from the resonator to the waveguide, while the lower mirror (108) must have high reflectivity, as any transmission through this mirror represents an energy loss from the structure. Multiple wavelength light emission can then be achieved by exciting different regions of the structure. The active material 104 will preferentially emit at wavelengths determined by the modes of the resonator at the gain (active) position (See Takada et al. Applied Physics Letters, Vol 63, pp. 2032–2034, 1993). Only one of these wavelengths will couple to the top waveguide. The rest of the light will remain in the resonator and propogate to the adjacent areas, where they will be absorbed. The light that couples to the top waveguide (100) will then propogate to the ends of the device and be emitted from the two apertures (112). The light will not couple back into the resonator, as the thickness of the resonator only corresponds to the wavelength at the position where the light was originally generated.

The structure of FIG. 1 is fabricated using a polymer waveguide (100) and GaAs/AlGa. As multi-layers. The layers were grown on a GaAs substrate (110) using low pressure MOCVD. The backmirror (108) consists of 35.5 periods of 76.2 nm/64 nm AlAs/AlGaAs layers, with the AlAs layers on the outside. The aluminum composition of the AlGaAs was 30%. The cavity containing the active material (104) consisted of six 7.5 nm GaAs quantum wells with AlAs barriers. The top mirror (106) consisted of seven periods of the same composition and thickness as the backmirror. The top waveguide was fabricated by spinning on a photosensitive polymer, exposing 30 $\mu$m wide waveguides, and developing away the unexposed regions. The thickness of this guide was approximately a uniform 5 $\mu$m, with an index of 1.598. All the AlGaAs/AlAs layers were all tapered long the direction of the waveguides by about 4% per cm. All these layers were undoped to allow for the optical excitation of the active material (104).

Figure 2:
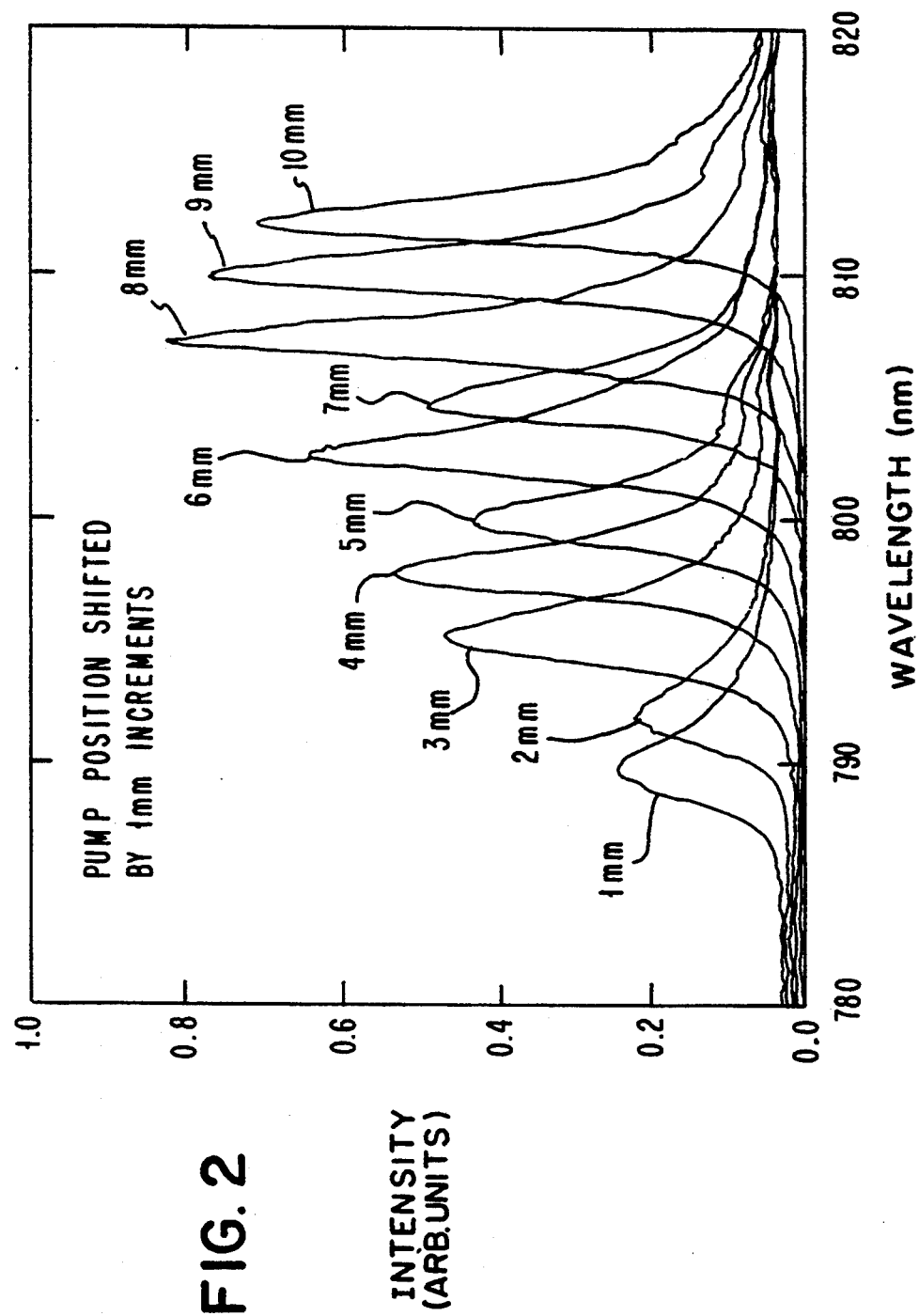
FIG. 2 schematically illustrates the observed output spectrum of FIG. 1 as the excitation region is varied along the device.

The entire processed structure was cleaved to form approximately 1 cm long waveguides. A beam (120) from a Ti:Sapphire laser was focused on different parts of the device, exciting the active region 104, and the output light monitored from one of the waveguide (100) ends. As the excitation position (gain region) changed, the output spectrum shifted. FIG. 2 shows the experimental results as the pump position was varied by 1 mm intervals.

Figure 3:
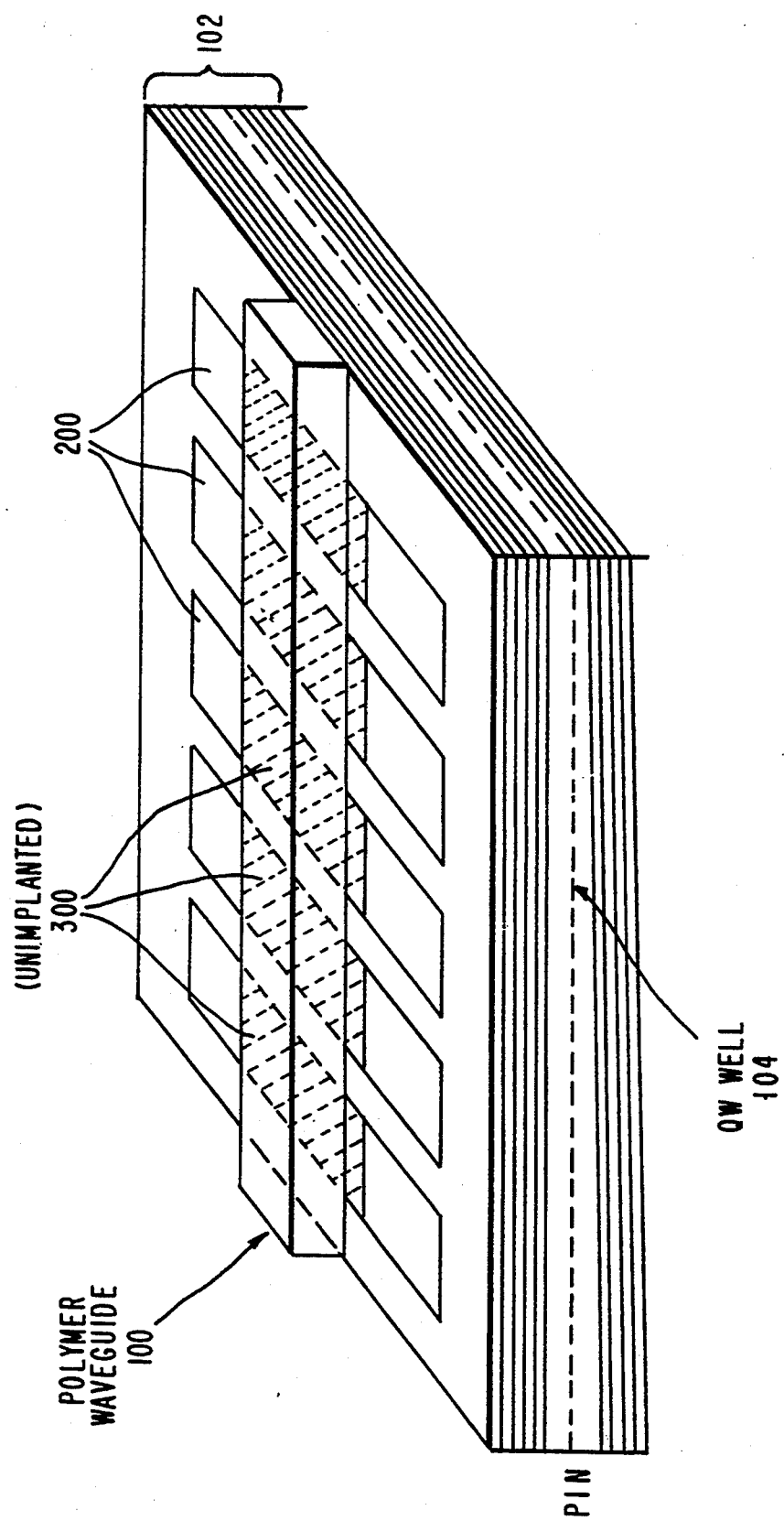
FIG. 3 graphically illustrates a multi-wavelength source with contact pads for electrical injection.

The structure of FIG. 1 can be improved by the addition of electrical pumping, and the spectrum narrowed by making waveguide 100 single mode. FIG. 3 represents an improved embodiment. In this case contact pads (200) are placed on either side of the waveguide, and the resonator is doped p-i-n, similar to vertical cavity surface emitting laser structures. A proton implant step electrically isolates each gain (active) region. The contact pads electrically inject carriers through the top mirror (106) and into the active material (104), while the second electrical contact is made through the backmirror (108) and the substrate (110). A deep implant below the contact regions can make use of current funneling to improve efficiency (see Y. H. Lee et al., Applied Physics Letters vol 3, pp. 108–110, 1991), or else the contact can be made just using the edge of each pad. The spectrum can also be narrowed if a single mode waveguide (100) is used. Since the waveguides of our demonstration device are very wide, they support a number of modes for each wavelength with different propagation constants. Since each mode couples to the resonator at a different wavelength, the output spectrum becomes broadened. Single mode guides can be fabricated using a combination of a thinner guiding region, and burying the structure in a material with a slightly smaller index than the guiding region.

Figure 4:
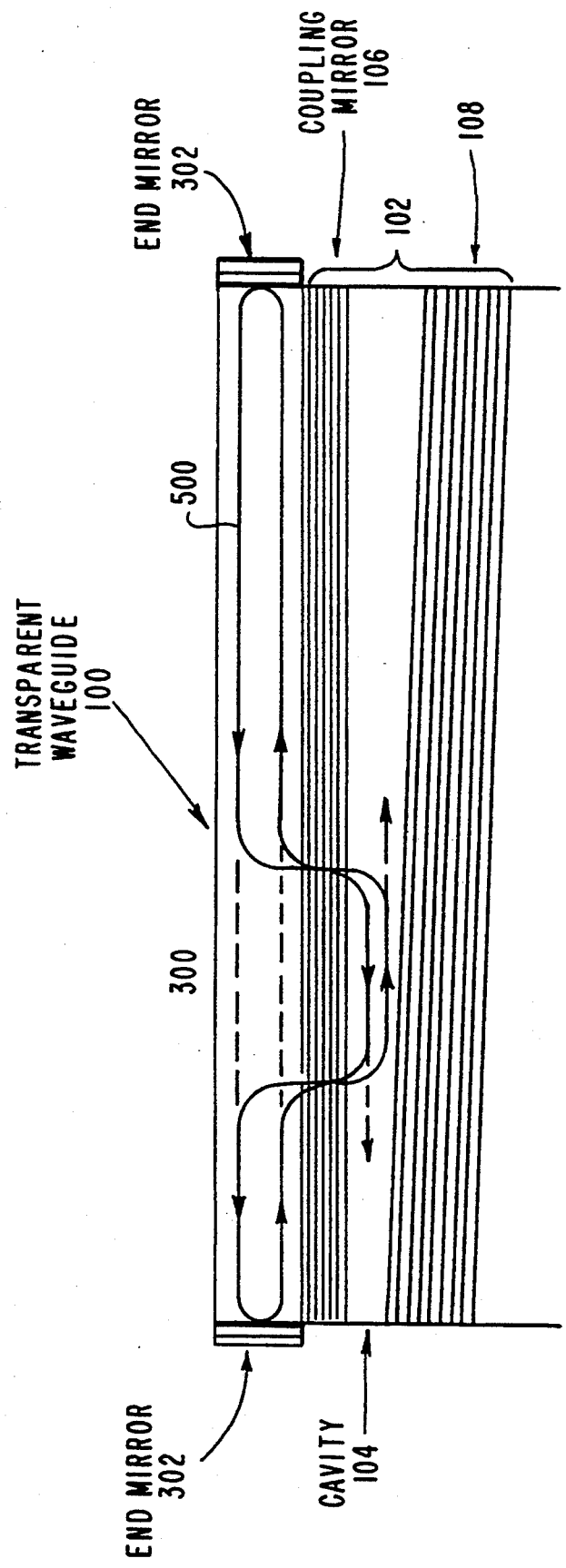
FIG. 4 illustrates a multi-wavelength laser with optical feedback.
Figure 5:
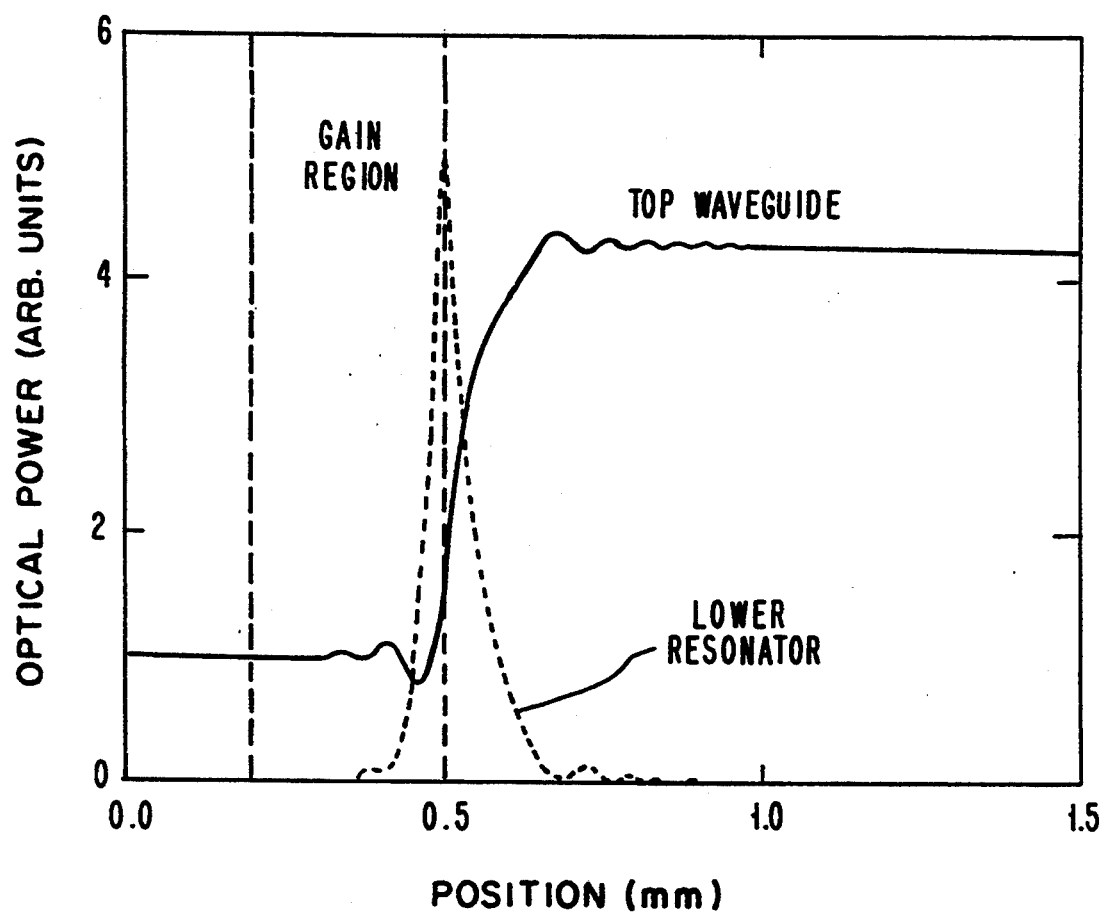
FIG. 5 shows the intensity of light in the waveguide and the resonator of FIG. 4 without the feedback. The optical field in the top waveguide is amplified as it passes the gain region.

The device of FIG. 1 can be made to lase if optical feedback is applied. The various layers of the device in addition to the feedback mirrors form a laser cavity, meaning there exits feedback paths at each wavelength passing through a gain region. The new structure is shown in FIG. 4. Shown also in FIG. 4 is feedback path 500 for one wavelength passing through the waveguide and the gain region. Each wavelength experiences a different feedback path, passing through a different gain region in the resonator. The optical feedback is supplied through end mirrors (302) at either end of the top waveguide. If the reflectivity of the top mirror (106) is increased so that the coupling between the resonator (102) and the waveguide (100) is only 50% efficient, single pass optical gain can result. Light that propogates in the top waveguide will partially couple to the resonator. The part that couples will experience gain and amplification, and part of this amplified beam will couple again to the top waveguide. If there is sufficient gain, there will be an overall amplification of the light in the top waveguide as it passes over the excited region (300). This gain will of course only occur at the phase-matched wavelength of the excited region. The structure, though simple, is not optimal, since part of the amplified beam remains in the resonator and is absorbed in the adjacent regions. However, if there is sufficient gain, the structure will lase, and pumping different regions simultaneously will cause multiple wavelengths to lase. FIG. 5 shows a calculation of single pass amplification in such a structure at a single wavelength for typical values of quantum well material: a total gain of 0.02 per when pumped, and a loss of 0.005 per $\mu m$ with no pumping. The top mirror was assumed to have a reflectivity 99.9%. We can see that the light in the top waveguide is amplified by a factor of four as it passes across the excited region.

A more complicated but more efficient structure is shown in FIG. 6, which is the preferred embodiment. In this case an additional transparent waveguide (400) is placed below the resonator. This waveguide is bounded from below by an additional mirror 402 of high reflectivity. Additionally, the resonator's lower mirror (108) reflectivity is reduced to allow coupling from the top transparent waveguide (100) to the lower transparent waveguide (400). The active material (104) remains in the resonator (102). The resonator and the transparent waveguide below (400) are both tapered, and can only couple to the top transparent guide at one position at a given wavelength. When phase matched, the light couples through the resonator and experiences gain. Since this transfer can have unity efficiency, no optical power is lost. The reflectivities of the resonator mirrors can be raised to increase the coupling length and allow for a greater interaction between the light and the active material. There is of course a trade-off between an increased coupling length for each wavelength, and the number of wavelengths available from a device of a given length. Since the cavity path is from the top waveguide into the lower waveguide, the end mirrors have to be positioned differently. Mirror 302 on one side of the device reflects the light in the top waveguide, while mirror 404 on the transparent guide reflects the light on the other side. Shown also in FIG. 6 is feedback path 500 passing through upper and lower waveguides and the gain region of the resonator. Note particularly in FIGS. 4 and 6 that multiple wavelengths can be emitted from a common aperture of the multiple wavelength laser, the aperture in this case in located at one of the end mirrors of the waveguides.

There are a number of material and device parameters that can be optimized in these multi-wavelength sources. Since the length of the device is relatively long, and the gain regions are only a short part of the total cavity path, the loss in the passive sections (waveguides 100, 400) must be minimized. Too much doping in the mirrors can induce free-carrier absorption, while a doping that is too low will raise the contact resistance and make carrier injection difficult in an electrically pumped structure. The end mirrors (302, 404) can be fabricated using a variety of methods known in the art. Evaporated dielectric multi-layers or metal mirrors can both be effective. The mirror used for the output may be of a lower value to maximize the power out of the device. In FIG. 5., if the output is extracted from the semiconductor waveguide (400), the reflectivity of a cleaved facet ($\simeq 30\%$) may be sufficient. High current injection will also perturb the effective refractive index of the cavity and modify the coupling between the resonator and the waveguide. This will limit devices where the taper is too gradual or the resonator Q too high.

We claim:
1. An apparatus for emitting multiple optical wavelengths, comprising:
   (a) a laser cavity having multiple gain regions and having at most two end mirrors; and
   (b) means for directing each of said optical wavelengths through a unique feedback loop which passes through a corresponding one of said regions.
2. An apparatus for emitting multiple wavelengths, comprising:
   (a) a passive optical waveguide; and
   (b) a tapered optical resonator with one of its mirrors also being one of a pair of confining mirrors of said waveguide, said resonator having active material for generation and gain of multiple optical wavelengths, which are transmitted through said optical waveguide and through a common aperture of said waveguide.
3. An apparatus as recited in claim 2, wherein said waveguide has a mirror at each end of its length for providing optical feedback.
4. An apparatus for emitting multiple wavelengths, comprising:
   (a) a tapered resonator with an active material for generation and gain of multiple optical wavelengths; and
   (b) a pair of passive optical waveguides above and below said resonator with a confining mirror of each of said waveguides also being a mirror of said resonator, each of said waveguides having an end mirror for providing an optical feedback loop for each of said wavelengths which passes through said waveguides and said resonator,
   wherein said multiple wavelengths pass through a common aperture of said apparatus.
5. A multiple wavelength laser, comprising:
   (a) an optical waveguide;
   (b) a resonator optically coupled to said optical waveguide, with the optical thickness of said resonator varying along its length;
   (c) means for pumping said resonator at selected gain regions so as to generate selected optical wavelengths, with each of said optical wavelengths being generated by pumping a corresponding one of said selected gain regions, and
   (d) means for transmitting each of said selected optical wavelengths from said resonator to said first optical waveguide, each of said optical being emitted through a common aperture of said waveguide.
6. A multiple wavelength laser as recited in claim 5, wherein said waveguide has a mirror at each end of its length, each said mirror being used to direct each of said selected wavelengths through a unique optical feedback loop which passes through a corresponding one of said selected gain regions.
7. A multiple wavelength laser as recited in claim 5, comprising:
   a pair of optical waveguides optically coupled to and adjacent to said resonator for directing said selected wavelengths through optical feedback loops, each of which passes through said optical waveguides and a corresponding one of selected gain regions.

8. A multiple wavelength laser as recited in claim 5, wherein said pumping means comprises an array of electrical contacts along two sides of said guide and on said resonator, with each of said contacts being near one of said selected gain regions of said resonator, with each of said selected wavelengths being generated by applying an electrical current to a corresponding one of said contacts.

9. A multiple wavelength laser, comprising:
   (a) an optical waveguide;
   (b) a resonator optically coupled to said optical waveguide, with the optical thickness of said resonator varying along its length;
   (c) an array of electrical contacts along two sides of said guide and on said resonator, with each of said contacts being near selected gain regions along the length of said resonator, with each one of said selected wavelengths being generated by applying an electrical current to a corresponding one of said contacts; and
   (d) means for transmitting each of said selected optical wavelengths from said resonator to said, waveguide with each of said selected wavelengths being transmitted along the length of said guide through a common aperture of said laser.

* * * * *